US007449233B2

(12) United States Patent
Arora

(10) Patent No.: US 7,449,233 B2
(45) Date of Patent: Nov. 11, 2008

(54) NANO STRUCTURED PHASED HYDROPHOBIC LAYERS ON SUBSTRATES

(75) Inventor: Pramod K. Arora, North Royalton, OH (US)

(73) Assignee: Innovation Chemical Technologies, Ltd, Cleveland, OH (US)

( * ) Notice: Subject to any disclaimer, the term of this patent is extended or adjusted under 35 U.S.C. 154(b) by 0 days.

(21) Appl. No.: 11/834,373

(22) Filed: Aug. 6, 2007

(65) Prior Publication Data

US 2008/0038509 A1 Feb. 14, 2008

Related U.S. Application Data

(60) Provisional application No. 60/821,932, filed on Aug. 9, 2006.

(51) Int. Cl.

| | |
|---|---|
| ***B32B 7/00*** | (2006.01) |
| ***B05D 1/36*** | (2006.01) |
| *C23C 16/44* | (2006.01) |

(52) U.S. Cl. ............. 428/212; 427/255.15; 427/255.17; 427/255.18; 427/430.1; 428/336; 428/429; 428/448; 428/450; 428/451

(58) Field of Classification Search ............ 427/255.15, 427/255.17, 255.18, 430.1; 428/212, 336, 428/429, 448, 450, 451

See application file for complete search history.

(56) References Cited

U.S. PATENT DOCUMENTS 6,153,304 A * 11/2000 Smith et al. ................. 428/447

* cited by examiner

*Primary Examiner*—D. S Nakarani
(74) *Attorney, Agent, or Firm*—Amin, Turocy & Calvin, LLP

(57) ABSTRACT

Disclosed are substrates with a first hydrophobic layer having a first contact angle and a second hydrophobic layer having a second contact angle, the first hydrophobic layer between the second hydrophobic layer and the substrate, the first contact angle being greater than the second contact angle.

20 Claims, No Drawings

NANO STRUCTURED PHASED HYDROPHOBIC LAYERS ON SUBSTRATES

CROSS-REFERENCE TO RELATED APPLICATIONS

This application claims the benefit of Provisional U.S. Patent Application Ser. No. 60/821,932, filed Aug. 9, 2006, the entirety of which is herein incorporated by reference.

TECHNICAL FIELD

The subject invention generally relates to substrates with an antireflection coating and multiple hydrophobic layers over the antireflection coating, methods of making the coated substrates.

BACKGROUND

Handling lenses and other glass substrates with a hydrophobic coating can be difficult due to the slippery nature of the hydrophobic coating. The slippery hydrophobic coating inhibits the ability to securely handle lenses with a hydrophobic coating, making processing of such lenses difficult.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

The subject invention provides substrates with an optional antireflection coating and multiple hydrophobic layers over the substrate or optional antireflection coating, convenient and simple methods of making coated substrates, and methods of making multiple hydrophobic layers that facilitate handling of substrates on which they are formed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

The invention provides for the formation of nano structured phased hydrophobic layers on substrates as a protective coating. As a result, processing the coated substrate occurs with minimal or without any difficulty. The nano structured phased hydrophobic layers involves forming at least two hydrophobic layers over a substrate. A first hydrophobic layer closer to the substrate has a contact angle higher than the contact angle of the second hydrophobic layer, which is positioned over the first hydrophobic layer. That is, the first hydrophobic layer is positioned between the substrate and the second hydrophobic layer.

Substrates include those with porous and non-porous surfaces such as glasses, ceramics, porcelains, fiberglass, metals, and organic materials including thermosets such as polycarbonate, and thermoplastics, and ceramic tile. Additional organic materials include polystyrene and its mixed polymers, polyolefins, in particular polyethylene and polypropylene, polyacrylic compounds, polyvinyl compounds, for example polyvinyl chloride and polyvinyl acetate, polyesters and rubber, and also filaments made of viscose and cellulose ethers, cellulose esters, polyamides, polyurethanes, polyesters, for example polyglycol terephthalates, and polyacrylonitrile.

Glasses specifically include lenses, such as eyewear lenses, microscope slides, decorative glass pieces, plastic sheets, mirror glass, papers, ceramic or marble tile, vehicle/automobile windows, shower doors, building windows and doors, television screens, computer screens, LCDs, mirrors, prisms, watch glass, lenses of optical devices such as binocular lenses, microscope lenses, telescope lenses, camera lenses, video lenses, and the like.

The substrates may or may not have an antireflection coating thereon. The antireflection coating contains a material of high surface energy. The antireflection coating may contain a single layer or multiple layers. Examples of antireflection coating include metal oxides such as silica, titania, alumina, zirconia, hafnia, combinations thereof, and the like. In one embodiment, the thickness of the antireflection coating is from about 0.1 nm to about 1,000 nm. In another embodiment, the thickness of the antireflection coating from about 1 nm to about 500 nm. In yet another embodiment, the thickness of the antireflection coating is from about 10 nm to about 250 nm.

The first hydrophobic layer contains at least one perfluoropolyether silicon compound (such as those described in co-pending U.S. Ser. No. 11/438,813 filed on May 23, 2006, which is hereby incorporated by reference) and/or at least one amphiphilic molecule (such as those described in U.S. Pat. No. 6,881,445, which is hereby incorporated by reference).

One end of a perfluoroether that is branched or unbranched is functionalized, then reacted with a hydrocarbon containing compound such as an allyl compound, then subject to hydrosilation with a silane to form a perfluoropolyether silicon compound. The perfluoropolyether silicon compound can be employed as a glass coating, such as an anti-scratch coating for eyeglasses.

In one embodiment, the perfluoropolyether silicon compounds are represented by Formula I:

$$R_mSiH_nR^2OCH_2Z \qquad (I)$$

where each R is independently an alkyl, hydroxyalkyl, alkoxy, alkyl ether, aryl, aryloxy, substituted aryl, all of which contain from about 1 to about 20 carbon atoms, halogens, hydroxy, and acetoxy; $R^2$ is alkyl containing from about 2 to about 10 carbon atoms; Z is fluorinated alkyl ether containing from about 2 to about 2,000 carbon atoms; and m is from about 1 to about 3, n is from 0 to about 2, and m+n equal 3. Halogens include fluorine, chlorine, bromine and iodine. In another embodiment, each R is independently an alkyl, hydroxyalkyl, alkoxy, all of which contain from about 2 to about 10 carbon atoms; $R^2$ is alkyl containing from about 2 to about 5 carbon atoms; Z is fluorinated alkyl ether containing from about 5 to about 1,500 carbon atoms; and m is from about 2 to about 3, n is from 0 to about 1, and m+n equal 3. The fluorinated alkyl ether may be branched or unbranched. Dimer compounds of Formula I are also possible perfluoropolyether silicon compounds ($R_mSiH_nR^2OCH_2ZCH_2OR^2SiH_nR_m$).

In another embodiment, the perfluoropolyether silicon compounds are represented by Formula IIa:

$$R_3SiCH_2CH_2CH_2OCH_2Z \quad \text{(IIa)}$$

where each R is independently an alkyl, hydroxyalkyl, alkoxy, alkyl ether, aryl, aryloxy, substituted aryl, all of which contain from about 1 to about 20 carbon atoms, halogens, hydroxy, and acetoxy; Z is fluorinated alkyl ether containing from about 2 to about 2,000 carbon atoms. In another embodiment, each R is independently an alkyl, hydroxyalkyl, alkoxy, all of which contain from about 2 to about 10 carbon atoms; and Z is fluorinated alkyl ether containing from about 10 to about 1,500 carbon atoms. The fluorinated alkyl ether may be branched or unbranched. The perfluoropolyether silicon compounds may also be dimer compounds of Formula IIa, such as those represented by Formula IIb:

$$R_3SiCH_2CH_2CH_2OCH_2ZCH_2OCH_2CH_2CH_2SiR_3 \quad \text{(IIb)}$$

where each R is independently an alkyl, hydroxyalkyl, alkoxy, alkyl ether, aryl, aryloxy, substituted aryl, all of which contain from about 1 to about 20 carbon atoms, halogens, hydroxy, and acetoxy; Z is fluorinated alkyl ether containing from about 2 to about 2,000 carbon atoms. In another embodiment, each R is independently an alkyl, hydroxyalkyl, alkoxy, all of which contain from about 2 to about 10 carbon atoms; and Z is fluorinated alkyl ether containing from about 5 to about 1,500 carbon atoms. The fluorinated alkyl ether may be branched or unbranched.

The fluorinated alkyl ether portion of the perfluoropolyether silicon compounds, often the "Z" portion in the equations above, contain repeating fluorocarbon ether units. Since too many examples exist to list each, exemplary examples include:

$$-[(CF_2)_nO]_mR^1 \quad \text{(III)}$$

$$-[(CF_2)_p(\underset{\substack{|\\R^1}}{CF})_qO]_mR^1 \quad \text{(IV)}$$

$$-[(\underset{\substack{|\\R^1}}{CF})_q(CF_2)_pO]_mR^1 \quad \text{(V)}$$

$$-[(CF_2)_pO(\underset{\substack{|\\R^1}}{CF})_q]_mR^1 \quad \text{(VI)}$$

$$-[(\underset{\substack{|\\R^1}}{CF})_qO(CF_2)_p]_mR^1 \quad \text{(VII)}$$

$$-[(CF_2)_p(\underset{\substack{|\\R^1}}{CF})_qO]_m[(CF_2)_nO]_mR^1 \quad \text{(VIII)}$$

$$-[(\underset{\substack{|\\R^1}}{CF})_q(CF_2)_pO]_m[(CF_2)_nO]_mR^1 \quad \text{(IX)}$$

$$-[(CF_2)_pO(\underset{\substack{|\\R^1}}{CF})_q]_m[(CF_2)_nO]_mR^1 \quad \text{(X)}$$

$$-[(\underset{\substack{|\\R^1}}{CF})_qO(CF_2)_p]_m[(CF_2)_nO]_mR^1 \quad \text{(XI)}$$

-continued $$-[(CF_2)_p(\underset{\substack{|\\R^1}}{CF})_qO]_m[(CF_2)_nO]_m[(\underset{\substack{|\\R^1}}{CF})_q(CF_2)_pO]_mR^1 \quad \text{(XII)}$$

$$-[(CF_2)_pO(\underset{\substack{|\\R^1}}{CF})_q]_m[(CF_2)_nO]_m[(\underset{\substack{|\\R^1}}{CF})_qO(CF_2)_pO]_mR^1 \quad \text{(XIII)}$$

wherein each $R^1$ is independently any of $CF_3$, $C_2F_5$, $C_3F_7$, $CF(CF_3)_2$, and similar groups such as similar fluoro-carbon groups and fluoro-hydrocarbon groups; each m is independently from about 2 to about 300; each n is independently from about 1 to about 5; each p is independently from about 0 to about 5; and each q is independently from about 0 to about 5. In another embodiment, each m is independently from about 5 to about 100; each n is independently from about 2 to about 4; each p is independently from about 1 to about 4; and each q is independently from about 1 to about 4. In any of the formulae above, occasional substitution of a fluorine atom with a hydrogen atom that does not affect the overall perfluoro nature of the fluorinated alkyl ether portion is acceptable.

In one embodiment, the perfluoropolyether silicon compounds do not contain an amide moiety (—CONH—) within the perfluoropolyether ligand of the silicon atom. Since an amide moiety with the perfluoropolyether ligand of the silicon atom may, in many instances, lead to a compound with thermal instability, the perfluoropolyether silicon compounds of the invention have excellent high temperature stability.

Generally speaking, the perfluoropolyether silicon compounds can be made by hydrosilating a hydrocarbylized perfluoroether. An example of a hydrocarbylized perfluoroether is a KRYTOX allyl ether available from DuPont. Alternatively, the perfluoropolyether silicon compounds can be made by hydrocarbylating a functionalized perfluoropolyether to provide a hydrocarbylized perfluoroether, which is then subject to hydrosilation to form the perfluoropolyether silicon compound.

The perfluoroethers that are functionalized, then reacted with a hydrocarbon containing compound such as an allyl compound, are the corresponding compounds of the fluorinated alkyl ether portions described above. For example, in the case of the fluorinated alkyl ether in Formulae (III)-(VIII), the perfluoroether starting material may be one or more of any of compounds represented by Formulae (XIV-II) to (XIX-VIII):

$$FOC[(CF_2)_nO]_mR^1 \quad \text{(XIV-III)}$$

$$R^2O_2C[(CF_2)_nO]_mR^1 \quad \text{(XV-III)}$$

$$R^2O[(CF_2)_nO]_mR^1 \quad \text{(XVI-III)}$$

$$HO_2C[(CF_2)_nO]_mR^1 \quad \text{(XVII-III)}$$

$$FO[(CF_2)_nO]_mR^1 \quad \text{(XVIII-III)}$$

$$HOH_2C[(CF_2)_nO]_mR^1 \quad \text{(XIX-III)}$$

$$FOC[(CF_2)_p(\underset{\substack{|\\R^1}}{CF})_qO]_mR^1 \quad \text{(XIV-IV)}$$

-continued (XV-IV)

$R^2O_2C[(CF_2)_p(CF)_qO]_mR^1$
|
$R^1$ (XVI-IV)

$R^2O[(CF_2)_p(CF)_qO]_mR^1$
|
$R^1$ (XVII-IV)

$HO_2C[(CF_2)_p(CF)_qO]_mR^1$
|
$R^1$ (XVIII-IV)

$FO[(CF_2)_p(CF)_qO]_mR^1$
|
$R^1$ (XIX-IV)

$HOH_2C[(CF_2)_p(CF)_qO]_mR^1$
|
$R^1$ (XIV-V)

$FOC[(CF)_q(CF_2)_pO]_mR^1$
|
$R^1$ (XV-V)

$R^2O_2C[(CF)_q(CF_2)_pO]_mR^1$
|
$R^1$ (XVI-V)

$R^2O[(CF)_q(CF_2)_pO]_mR^1$
|
$R^1$ (XVII-V)

$HO_2C[(CF)_q(CF_2)_pO]_mR^1$
|
$R^1$ (XVIII-V)

$FO[(CF)_q(CF_2)_pO]_mR^1$
|
$R^1$ (XIX-V)

$HOH_2C[(CF)_q(CF_2)_pO]_mR^1$
|
$R^1$ (XIV-VI)

$FOC[(CF_2)_pO(CF)_q]_mR^1$
|
$R^1$ (XV-VI)

$R^2O_2C[(CF_2)_pO(CF)_q]_mR^1$
|
$R^1$ (XVI-VI)

$R^2O[(CF_2)_pO(CF)_q]_mR^1$
|
$R^1$ (XVII-VI)

$HO_2C[(CF_2)_pO(CF)_q]_mR^1$
|
$R^1$ (XVIII-VI)

$FO[(CF_2)_pO(CF)_q]_mR^1$
|
$R^1$ (XIX-VI)

$HOH_2C[(CF_2)_pO(CF)_q]_mR^1$
|
$R^1$ (XIV-VII)

$FOC[(CF)_qO(CF_2)_p]_mR^1$
|
$R^1$ (XV-VII)

$R^2O_2C[(CF)_qO(CF_2)_p]_mR^1$
|
$R^1$

-continued (XVI-VII)

$R^2O[(CF)_qO(CF_2)_p]_mR^1$
|
$R^1$ (XVII-VII)

$HO_2C[(CF)_qO(CF_2)_p]_mR^1$
|
$R^1$ (XVIII-VII)

$FO[(CF)_qO(CF_2)_p]_mR^1$
|
$R^1$ (XIX-VII)

$HOH_2C[(CF)_qO(CF_2)_p]_mR^1$
|
$R^1$ (XIV-VIII)

$FOC[(CF_2)_p(CF)_qO]_m[(CF_2)_nO]_mR^1$
|
$R^1$ (XV-VIII)

$R^2O_2C[(CF_2)_p(CF)_qO]_m[(CF_2)_nO]_mR^1$
|
$R^1$ (XVI-VIII)

$R^2O[(CF_2)_p(CF)_qO]_m[(CF_2)_nO]_mR^1$
|
$R^1$ (XVII-VIII)

$HO_2C[(CF_2)_p(CF)_qO]_m[(CF_2)_nO]_mR^1$
|
$R^1$ (XVIII-VIII)

$FO[(CF_2)_p(CF)_qO]_m[(CF_2)_nO]_mR^1$
|
$R^1$ (XIX-VIII)

$HOH_2C[(CF_2)_p(CF)_qO]_m[(CF_2)_nO]_mR^1$
|
$R^1$ (XIV-IX)

$FOC[(CF)_q(CF_2)_pO]_m[(CF_2)_nO]_mR^1$
|
$R^1$ (XV-IX)

$R^2O_2C[(CF)_q(CF_2)_pO]_m[(CF_2)_nO]_mR^1$
|
$R^1$ (XVI-IX)

$R^2O[(CF)_q(CF_2)_pO]_m[(CF_2)_nO]_mR^1$
|
$R^1$ (XVII-IX)

$HO_2C[(CF)_q(CF_2)_pO]_m[(CF_2)_nO]_mR^1$
|
$R^1$ (XVIII-IX)

$FO[(CF)_q(CF_2)_pO]_m[(CF_2)_nO]_mR^1$
|
$R^1$ (XIX-IX)

$HOH_2C[(CF)_q(CF_2)_pO]_m[(CF_2)_nO]_mR^1$
|
$R^1$ (XIV-X)

$FOC[(CF_2)_pO(CF)_q]_m[(CF_2)_nO]_mR^1$
|
$R^1$ (XV-X)

$R^2O_2C[(CF_2)_pO(CF)_q]_m[(CF_2)_nO]_mR^1$
|
$R^1$ (XVI-X)

$R^2O[(CF_2)_pO(CF)_q]_m[(CF_2)_nO]_mR^1$
|
$R^1$

-continued (XVII-X)

$$HO_2C[(CF_2)_pO(CF)_q]_m[(CF_2)_nO]_mR^1$$
$R^1$ (XVIII-X)

$$FO[(CF_2)_pO(CF)_q]_m[(CF_2)_nO]_mR^1$$
$R^1$ (XIX-X)

$$HOH_2C[(CF_2)_pO(CF)_q]_m[(CF_2)_nO]_mR^1$$
$R^1$ (XIV-XI)

$$FOC[(CF)_qO(CF_2)_p]_m[(CF_2)_nO]_mR^1$$
$R^1$ (XV-XI)

$$R^2O_2C[(CF)_qO(CF_2)_p]_m[(CF_2)_nO]_mR^1$$
$R^1$ (XVI-XI)

$$R^2O[(CF)_qO(CF_2)_p]_m[(CF_2)_nO]_mR^1$$
$R^1$ (XVII-XI)

$$HO_2C[(CF)_qO(CF_2)_p]_m[(CF_2)_nO]_mR^1$$
$R^1$ (XVIII-XI)

$$FO[(CF)_qO(CF_2)_p]_m[(CF_2)_nO]_mR^1$$
$R^1$ (XIX-XI)

$$HOH_2C[(CF)_qO(CF_2)_p]_m[(CF_2)_nO]_mR^1$$
$R^1$ (XIV-XII)

$$FOC[(CF_2)_p(CF)_qO]_m[(CF_2)_nO]_m[(CF)_q(CF_2)_pO]_mR^1$$
$R^1$ $R^1$ (XV-XII)

$$R^2O_2C[(CF_2)_p(CF)_qO]_m[(CF_2)_nO]_m[(CF)_q(CF_2)_pO]_mR^1$$
$R^1$ $R^1$ (XVI-XII)

$$R^2O[(CF_2)_p(CF)_qO]_m[(CF_2)_nO]_m[(CF)_q(CF_2)_pO]_mR^1$$
$R^1$ $R^1$ (XVII-XII)

$$HO_2C[(CF_2)_p(CF)_qO]_m[(CF_2)_nO]_m[(CF)_q(CF_2)_pO]_mR^1$$
$R^1$ $R^1$ (XVIII-XII)

$$FO[(CF_2)_p(CF)_qO]_m[(CF_2)_nO]_m[(CF)_q(CF_2)_pO]_mR^1$$
$R^1$ $R^1$ (XIX-XII)

$$HOH_2C[(CF_2)_p(CF)_qO]_m[(CF_2)_nO]_m[(CF)_q(CF_2)_pO]_mR^1$$
$R^1$ $R^1$ (XIV-XIII)

$$FOC[(CF_2)_pO(CF)_q]_m[(CF_2)_nO]_m[(CF)_qO(CF_2)_p]_mR^1$$
$R^1$ $R^1$ (XV-XIII)

$$R^2O_2C[(CF_2)_pO(CF)_q]_m[(CF_2)_nO]_m[(CF)_qO(CF_2)_p]_mR^1$$
$R^1$ $R^1$ (XVI-XIII)

$$R^2O[(CF_2)_pO(CF)_q]_m[(CF_2)_nO]_m[(CF)_qO(CF_2)_p]_mR^1$$
$R^1$ $R^1$ (XVII-XIII)

$$HO_2C[(CF_2)_pO(CF)_q]_m[(CF_2)_nO]_m[(CF)_qO(CF_2)_p]_mR^1$$
$R^1$ $R^1$

-continued (XVIII-XIII)

$$FO[(CF_2)_pO(CF)_q]_m[(CF_2)_nO]_m[(CF)_qO(CF_2)_p]_mR^1$$
$R^1$ $R^1$ (XIX-XIII)

$$HOH_2C[(CF_2)_pO(CF)_q]_m[(CF_2)_nO]_m[(CF)_qO(CF_2)_p]_mR^1$$
$R^1$ $R^1$ wherein each $R^1$ is independently any of $CF_3$, $C_2F_5$, $C_3F_7$, $CF(CF_3)_2$, and similar groups such as similar fluorocarbon groups and fluoro-hydrocarbon groups; $R^2$ is as described above; each m is independently from about 2 to about 300; and each n is independently from about 1 to about 5. In another embodiment, each m is independently from about 5 to about 100; and each n is independently from about 2 to about 4. Each of the six types of end groups (FOC—, $R^2O_2C$—, $R^2O$—, $HO_2C$—, $HOH_2C$—, and FO—) on the left side of each chemical formula may be applied to each of Formulae (III)-(XIII) to provide additional examples of perfluoroethers. The occasional substitution of a fluorine atom with a hydrogen atom in the perfluoroether starting materials that does not affect the overall perfluoro nature of the perfluoroether is acceptable.

Some perfluoroethers are commercially available, for example, from DuPont under the trade designation KRYTOX perfluoroethers; from Ausimont/Montedison/Solvay under the trade designations FOMBLIN fluids, FLUOROLINK fluids, and GALDEN fluids; from Daikin Industries under the trade designation OPTOOL DSX and AES fluorocarbon compounds and DEMNUM fluids and greases; and from Shin-Etsu under the trade designations KY-7, X-7-101, AND X-71-130. It is believed that KRYTOX perfluoroethers have the chemical formula of $CF_3CF_2CF_2O$—$[CFCF_3CF_2O]_n$—$CFCF_3CF_2COOH$ mono acid; that FOMBLIN fluids have the chemical formula of HOOC—$CF_2O$—$[CF_2CF_2O]_n$—$[CF_2O]_mCF_2COOH$ diacid; and that DEMNUM fluids have the chemical formula of $CF_3CF_2CF_2O$—$[CF_2CF_2CF_2O]_n$—$CF_2CF_2COOH$ mono acid, wherein m and n are defined as above.

Preferably, regardless of the specific perfluoroether starting material employed, the starting material is treated using known organic synsthesis techniques to form the an alcohol perfluoroether, such as the following:

(XIX-III)

$$HOH_2C[(CF_2)_nO]_mR^1$$

(XIX-IV)

$$HOH_2C[(CF_2)_p(CF)_qO]_mR^1$$
$R^1$ (XIX-V)

$$HOH_2C[(CF)_q(CF_2)_pO]_mR^1$$
$R^1$ (XIX-VI)

$$HOH_2C[(CF_2)_pO(CF)_q]_mR^1$$
$R^1$ (XIX-VII)

$$HOH_2C[(CF)_qO(CF_2)_p]_mR^1$$
$R^1$ (XIX-VIII)

$$HOH_2C[(CF_2)_p(CF)_qO]_m[(CF_2)_nO]_mR^1$$
$R^1$

-continued (XIX-IX)

$$HOH_2C[(CF)_q(CF_2)_pO]_m[(CF_2)_nO]_mR^1$$
$R^1$ (XIX-X)

$$HOH_2C[(CF_2)_pO(CF)_q]_m[(CF_2)_nO]_mR^1$$
$R^1$ (XIX-XI)

$$HOH_2C[(CF)_qO(CF_2)_p]_m[(CF_2)_nO]_mR^1$$
$R^1$ (XIX-XII)

$$HOH_2C[(CF_2)_p(CF)_qO]_m[(CF_2)_nO]_m[(CF)_q(CF_2)_pO]_mR^1$$
$R^1$ $R^1$ (XIX-XIII)

$$HOH_2C[(CF_2)_pO(CF)_q]_m[(CF_2)_nO]_m[(CF)_qO(CF_2)_p]_mR^1$$
$R^1$ $R^1$ wherein $R^1$, m, and n are as defined above. Again, it is understood that any of Formulae (III)-(XIII) can treated to provide the corresponding alcohol perfluoroether (the compounds of Formulae (III)-(XIII) having a $CH_2OH$ group on the left side of the formulae).

The perfluoroethers and preferably the alcohol perfluoroethers may be functionalized by combining a given perfluoroether with an alcohol, such as a lower alkyl alcohol (C1-C5) such as methanol, ethanol, isopropanol, propanol, butanol, isobutanol, t-butanol, pentanol, isopentanol, amylalcohol, a metal lower alkyl alcoholate, such as an alkali metal alcoholate such as sodium methylate, sodium ethylate, and sodium isopropylate, or a metal fluoride (alkali metal, alkaline earth metal, or transition metal). When a metal lower alkyl alcoholate is used, the corresponding alcohol is formed (corresponding to the alcoholate) as a byproduct and the resulting functionalized perfluoroether is a metal alcoholate perfluoroether. For example, the metal alcoholate perfluoroether of Formulae (XIX-III)-(XIX-VIII) have the following formula:

(XX-III)

$$MOH_2C[(CF_2)_nO]_mR^1$$

(XX-IV)

$$MOH_2C[(CF_2)_p(CF)_qO]_mR^1$$
$R^1$ (XX-V)

$$MOH_2C[(CF)_q(CF_2)_pO]_mR^1$$
$R^1$ (XX-VI)

$$MOH_2C[(CF_2)_pO(CF)_q]_mR^1$$
$R^1$ (XX-VII)

$$MOH_2C[(CF)_qO(CF_2)_p]_mR^1$$
$R^1$ (XX-VIII)

$$MOH_2C[(CF_2)_p(CF)_qO]_m[(CF_2)_nO]_mR^1$$
$R^1$ (XX-IX)

$$MOH_2C[(CF)_q(CF_2)_pO]_m[(CF_2)_nO]_mR^1$$
$R^1$ (XX-X)

$$MOH_2C[(CF_2)_pO(CF)_q]_m[(CF_2)_nO]_mR^1$$
$R^1$

-continued (XX-XI)

$$MOH_2C[(CF)_qO(CF_2)_p]_m[(CF_2)_nO]_mR^1$$
$R^1$ (XX-XII)

$$MOH_2C[(CF_2)_p(CF)_qO]_m[(CF_2)_nO]_m[(CF)_q(CF_2)_pO]_mR^1$$
$R^1$ $R^1$ (XX-XIII)

$$MOH_2C[(CF_2)_pO(CF)_q]_m[(CF_2)_nO]_m[(CF)_qO(CF_2)_p]_mR^1$$
$R^1$ $R^1$ wherein M is a metal, such as an alkali or alkaline earth metal; $R^1$, m, and n are as defined above. Examples of alkali and alkaline earth metals include lithium, sodium, potassium, ruthenium, cesium, magnesium, calcium, strontium, barium, and the like. Again, it is understood that any of Formulae (III)-(XIII) and their corresponding Formulae (XIV)-(XIX) may be treated to provide the corresponding metal alcoholate perfluoroether (the compounds of Formulae (III)-(XIII) having a $CH_2OM$ group on the left side of the formulae).

The functionalized perfluoroether, such as a metal alcoholate perfluoroether or alcohol perfluoro ether, is contacted with a hydrocarbon containing compound such as an allyl compound or a styrene compound. Hydrocarbylization of the functionalized perfluoroether takes place, which facilitates subsequent attachment of the perfluoroether to a silane compound. For example, an allyl compound may be represented by (XXI)

$$XCHCH{=}CH_2$$
$R^4$ wherein X is a reactive group such as halogen or hydroxy, and $R^4$ is hydrogen, alkyl, hydroxyalkyl, alkoxy, alkyl ether, aryl, aryloxy, substituted aryl, all of which contain from about 1 to about 20 carbon atoms, halogens, hydroxy, and acetoxy.

Some hydrocarbylized perfluoroethers are commercially available, for example, from DuPont under the trade designation KRYTOX allyl ethers. Moreover, the synthesis of such compounds is described in U.S. Pat. No. 6,753,301, which is hereby incorporated by reference. Methods of making and processing allyl ethers is also described in Howell et al, New derivatives of poly-hexafluoropropylene oxide from the corresponding alcohol, *Journal of Fluorine Chemistry,* 126 (2005) 281-288, which is hereby incorporated by reference.

The hydrocarbylized perfluoroether is subject to hydrosilation by contact with a silane compound, preferably in the presence of a catalyst, to form a perfluoropolyether silicon compound. Examples of the silane compounds are represented by Formula (XXII):

$$R_mSiH_n \qquad \text{(XXII)}$$

where each R is independently an alkyl, hydroxyalkyl, alkoxy, alkyl ether, aryl, aryloxy, substituted aryl, all of which contain from about 1 to about 20 carbon atoms, halogens, hydroxy, and acetoxy; and m is from about 2 to about 3, n is from 1 to about 2, and m+n equal 4. In another embodiment, each R is independently an alkyl, hydroxyalkyl, alkoxy, alkyl ether, aryl, aryloxy, substituted aryl, all of which contain from about 1 to about 20 carbon atoms; and m is about 3, and n is about 1. In this sense, triorgano silanes can be employed as the silane compound.

Examples of silane compounds include dialkoxyalkyl silanes such as diisopropenoxymethylsilane, dimethoxymethylsilane, diethoxymethylsilane, dipropoxymethylsilane, and dibutoxymethylsilane; trialkoxy silanes such as triisopropenoxysilane trimethoxysilane triethoxysilane tripropoxysilane tributoxysilane; dihalosilanes and trihalosilanes such as trichlorosilane, alkyldichlorosilane. Hundreds of additional examples are not listed for brevity.

Any suitable catalyst can be employed to promote the hydrosilation reaction. Examples of hydrosilation catalysts include platinum containing catalysts such as platinum black, platinum supported on silica, platinum supported on carbon, chloroplatinic acid such as $H_2PtCl_6$, alcohol solutions of chloroplatinic acid, platinum/olefin complexes, platinum/alkenylsiloxane complexes, platinum/beta-diketone complexes, platinum/phosphine complexes and the like; palladium containing catalysts such as palladium on carbon, palladium chloride and the like; nickel containing catalysts; rhodium catalysts, such as rhodium chloride and rhodium chloride/di(n-butyl)sulfide complex and the like; chromium catalysts; other precious metal catalysts, and the like.

The hydrosilation reaction can be carried out using methods known in the art, such as Speier, Homogenous catalysis of hydrosilation by transition metals, *Advances in Organometallic Chemistry*, vol. 17, pp 407-447, 1979, which is hereby incorporated by reference.

One example of a specific reaction scheme is as follows.

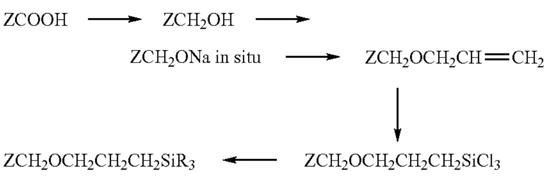

where each R is independently an alkyl, hydroxyalkyl, alkoxy, alkyl ether, aryl, aryloxy, substituted aryl, all of which contain from about 1 to about 20 carbon atoms, halogens, hydroxy, and acetoxy; Z is fluorinated alkyl ether containing from about 2 to about 2,000 carbon atoms.

Amphiphilic molecules typically have head and tail groups (tail being a nonreactive, non-polar group and head being reactive, polar group). Amphiphilic molecules generally include polymerizable amphiphilic molecules, hydrolyzable alkyl silanes, hydrolyzable perhaloalkyl silanes, chlorosilanes, polysiloxanes, alkyl silazanes, perfluoroalkyl silazanes, disilazanes, and silsesquioxanes.

The polar group or moiety of the amphiphile can be a carboxylic acid, alcohol, thiol, primary, secondary and tertiary amine, cyanide, silane derivative, phosphonate, and sulfonate and the like. The non-polar group or moiety mainly includes alkyl groups, per fluorinated alkyl groups, alkyl ether groups, and per-fluorinated alkyl ether groups. These non-polar groups may include diacetylene, vinyl-unsaturated or fused linear or branched aromatic rings.

In one embodiment, the amphiphilic molecule is represented by Formula XXIII:

$$R_mSiZ_n \quad \text{(XXIII)}$$

where each R is individually an alkyl, fluorinated alkyl, alkyl ether or fluorinated alkyl ether containing from about 1 to about 30 carbon atoms, substituted silane, or siloxane; each Z is individually one of halogens, hydroxy, alkoxy and acetoxy; and m is from about 1 to about 3, n is from about 1 to about 3, and m+n equal 4. In another embodiment, R is an alkyl, fluorinated alkyl, an alkyl ether or a fluorinated alkyl ether containing from about 6 to about 20 carbon atoms. The alkyl group may contain the diacetylene, vinyl-unsaturated, single aromatic and fused linear or branched aromatic rings.

In another embodiment, the amphiphilic molecule is represented by Formula XXIV:

$$R_mSH_n \quad \text{(XXIV)}$$

where R is an alkyl, fluorinated alkyl, an alkyl ether or a fluorinated alkyl ether containing from about 1 to about 30 carbon atoms; S is sulfur; H is hydrogen; m is from about 1 to about 2 and n is from 0 to 1. In another embodiment, R is an alkyl, fluorinated alkyl, an alkyl ether or a fluorinated alkyl ether containing from about 6 to about 20 carbon atoms. The alkyl chain may contain diacetylene, vinyl, single aromatics, or fused linear or branched aromatic moieties.

In yet another embodiment, the amphiphilic molecule is represented by RY, where R is an alkyl, fluorinated alkyl, an alkyl ether or a fluorinated alkyl ether containing from about 1 to about 30 carbon atoms and Y is one of the following functional groups: —COOH, —$SO_3H$, —$PO_3$, —OH, and —$NH_2$. In another embodiment, R is an alkyl, fluorinated alkyl, an alkyl ether or a fluorinated alkyl ether containing from about 6 to about 20 carbon atoms. The alkyl chain may contain diacetylene, vinyl-unsaturated, single aromatic, or fused linear or branched aromatic moieties.

In still yet another embodiment, the amphiphilic molecule may include one or more of the following Formulae (XXV) and (XXVI):

$$CF_3(CF_2)_7CH_2CH_2\text{—}Si(CH_3)_2Cl \quad \text{(XXV)}$$

$$CF_3(CF_2)_7CH_2CH_2\text{—}Si(OEt)_3 \quad \text{(XXVI)}$$

In another embodiment, the amphiphilic molecule is a disilazane represented by Formula XXVII:

$$RSiNSiR \quad \text{(XXVII)}$$

where R is an alkyl, fluorinated alkyl, an alkyl ether or a fluorinated alkyl ether containing from about 1 to about 30 carbon atoms. In another embodiment, R is an alkyl, fluorinated alkyl, an alkyl ether or a fluorinated alkyl ether containing from about 6 to about 20 carbon atoms.

In another embodiment, the amphiphilic molecule is represented by Formula XXVIII:

$$R(CH_2CH_2O)_qP(O)_x(OH)_y \quad \text{(XXVIII)}$$

where R is an alkyl, fluorinated alkyl, an alkyl ether or a fluorinated alkyl ether containing from about 1 to about 30 carbon atoms, q is from about 1 to about 10, and x and y are independently from about 1 to about 4.

In still yet another embodiment, the amphiphilic molecule is formed by polymerizing a silicon containing compound, such as tetraethylorthosilicate (TEOS), tetramethoxysilane, and/or tetraethoxysilane Amphiphilic molecules (and in some instances compositions containing amphiphilic molecules) are described in U.S. Pat. Nos. 6,238,781; 6,206,191; 6,183,872; 6,171,652; 6,166,855 (overcoat layer); 5,897,918; 5,851,674; 5,822,170; 5,800,918; 5,776,603; 5,766,698; 5,759,618; 5,645,939; 5,552,476; and 5,081,192; Hoffmann et al., and "Vapor Phase Self-Assembly of Fluorinated Monlayers on Silicon and German Oxide," Langmuir, 13, 1877-1880, 1997; which are hereby incorporated by reference for their teachings of amphiphilic materials.

Specific examples of amphiphilic molecules and compounds that can be hydrolyzed into amphiphilic materials include octadecyltrichlorosilane; octyltrichlorosilane; heptadecafluoro-1,1,2,2-tetrahydrodecyl trichlorosilane available from Shin Etsu under the trade designation KA-7803; hexadecyl trimethoxysilane available from Degussa under the trade designation Dynasylan 9116; tridecafluorooctyl triethoxysilane available from Degussa under the trade designation Dynasylan F 8261; methyltrimethoxysilane available from Degussa under the trade designation Dynasylan MTMS; methyltriethoxysilane available from Degussa under the trade designation Dynasylan MTES; propyltrimethoxysilane available from Degussa under the trade designation Dynasylan PTMO; propyltriethoxysilane available from Degussa under the trade designation Dynasylan PTEO; butyltrimethoxysilane available from Degussa under the trade designation Dynasylan IBTMO; butyltriethoxysilane available from Degussa under the trade designation Dynasylan BTEO; octyltriethoxysilane available from Degussa under the trade designation Dynasylan OCTEO; fluoroalkylsilane in ethanol available from Degussa under Dynasylan 8262; fluoroalkylsilane-formulation in isopropanol available from Degussa under Dynasylan F 8263; modified fluoroalkyl-siloxane available from Degussa under Dynasylan® F 8800; and a water-based modified fluoroalkyl-siloxane available from Degussa under Dynasylan F 8810. Additional examples of amphiphilic molecules and compounds that can be hydrolyzed into amphiphilic materials include fluorocarbon compounds and hydrolyzates thereof under the trade designation Optool DSX available from Daikin Industries, Ltd.; silanes under the trade designations KA-1003 (vinyltrichloro silane), KBM-1003 (vinyltrimethoxy silane), KBE-1003 (vinyltriethoxy silane), KBM-703 (chloropropyltrimethoxy silane), X-12-817H, X-71-101, X-24-7890, KP801M, KA-12 (methyldichloro silane), KA-13 (methyltrichloro silane), KA-22 (dimethyldichloro silane), KA-31 (trimethylchloro silane), KA-103 (phenyltrichloro silane), KA-202 (diphenyldichloro silane), KA-7103 (trifluoropropyl trichloro silane), KBM-13 (methyltrimethoxy silane), KBM-22 (dimethyldimethoxy silane), KBM-103 (phenyltrimethoxy silane), KBM-202SS (diphenyldimethoxy silane), KBE-13 (methyltriethoxy silane), KBE-22 (dimethyldiethoxy silane), KBE-103 (phenyltriethoxy silane), KBE-202 (diphenyldiethoxy silane), KBM-3063 (hexyltrimethoxy silane), KBE-3063 (hexyltriethoxy silane), KBM-3103 (decyltrimethoxy silane), KBM-7103 (trifluoropropyl trimethoxysilane), KBM-7803 (heptadecafluoro-1,1,2,2-tetrahydrodecyl trimethoxysilane), and KBE-7803 (heptadecafluoro-1,1,2,2-tetrahydrodecyl triethoxysilane) available from Shin Etsu.

Additional specific examples of amphiphilic materials include $C_9F_{19}C_2H_4Si(OCH_3)_3$; $(CH_3O)_3SiC_2H_4C_6F_{12}C_2H_4Si(OCH_3)_3$; $C_9F_{19}C_2H_4Si(NCO)_3$; $(OCN)_3SiC_2H_4Si(NCO)_3$; $Si(NCO)_4$; $Si(OCH_3)_4$; $CH_3Si(OCH_3)_3$; $CH_3Si(NCO)_3$; $C_8H_{17}Si(NCO)_3$; $(CH_3)_2Si(NCO)_2$; $C_8F_{17}CH_2CH_2Si(NCO)_3$; $(OCN)_3SiC_2H_4C_6F_{12}C_2H_4Si(NCO)_3$; $(CH_3)_3SiO—[Si(CH_3)_2—O—]_n—Si(CH_3)_3$ (viscosity of 50 centistokes); $(CH_3O)_2(CH_3)SiC_2H_4C_6F_{12}C_2H_4Si(CH_3)(OCH_3)_2$; $C_8F_{17}CH_2CH_2Si(OCH_3)_3$; dimethylpolysiloxane having a viscosity of 50 centistokes (KF96, manufactured by Shin Etsu); modified diemthylpolysiloxane having a viscosity of 42 centistokes and having hydroxyl groups at both terminals (KF6001, manufactured by Shin Etsu); and modified dimethylpolysiloxane having a viscosity of 50 centistokes and having carboxyl groups (X-22-3710, manufactured by Shin Etsu).

In another embodiment, the amphlphilic material contains a repeating unit of a polyorganosiloxane introduced into a fluoropolymer. The fluoropolymer having the repeating unit of a polyorganosiloxane can be obtained by a polymerization reaction of a fluoromonomer and a polyorganosiloxane having a reactive group as a terminal group. The reactive group is formed by chemically binding an ethylenically unsaturated monomer (e.g., acrylic acid, an ester thereof, methacrylic acid, an ester thereof, vinyl ether, styrene, a derivative thereof) to the end of the polyorganosiloxane.

The fluoropolymer can be obtained by a polymerization reaction of an ethylenically unsaturated monomer containing fluorine atom (fluoromonomer). Examples of the fluoromonomers include fluoroolefins (e.g., fluoroethylene, vinylidene fluoride, tetrafluoroethylene, hexafluoropropylene, perfluoro-2,2-dimethyl-1,3-diol), fluoroalkyl esters of acrylic or methacrylic acid and fluorovinyl ethers. Two or more fluoromonomers can be used to form a copolymer.

A copolymer of a fluoromonomer and another monomer can also be used as the amphiphilic material. Examples of the other monomers include olefins (e.g., ethylene, propylene, isoprene, vinyl chloride, vinylidene chloride), acrylic esters (e.g., methyl acrylate, ethyl acrylate, 2-ethylhexyl acrylate), methacrylic esters (e.g., methyl methacrylate, ethyl methacrylate, butyl methacrylate, ethylene glycol dimethacrylate), styrenes (e.g., styrene, vinyltoluene, alpha.-methylstyrene), vinyl ethers (e.g., methyl vinyl ether), vinyl esters (e.g., vinyl acetate, vinyl propionate, vinyl cinnamate), acrylamides (e.g., N-tert-butylacrylamide, N-cyclohexylacrylamide), methacrylamides and acrylonitriles.

Amphiphilic molecules further include the hydrolyzation products of any of the compounds described above. In particular, treating any of the above described compounds with an acid or base yields amphiphilic materials ideally suited for forming thin film on substrates.

Amphiphilic molecules specifically include polyhedral oligomeric silsesquioxanes (POSS), and such compounds are described in U.S. Pat. Nos. 6,340,734; 6,284,908; 6,057,042; 5,691,396; 5,589,562; 5,422,223; 5,412,053; *J. Am. Chem. Soc.* 1992, 114, 6701-6710; *J. Am. Chem. Soc.* 1990, 112, 1931-1936; *Chem. Rev.* 1995, 95, 1409-1430; and *Langmuir,* 1994, 10, 4367, which are hereby incorporated by reference. The POSS oligomers/polymers contain reactive hydroxyl groups. Moreover, the POSS polymers/oligomers have a relatively rigid, thermally stable silicon-oxygen framework that contains an oxygen to silicon ratio of about 1.5. These compounds may be considered as characteristically intermediate between siloxanes and silica. The inorganic framework is in turn covered by a hydrocarbon/fluorocarbon outer layer enabling solubilization and derivatization of these systems, which impart hydrophobic/oleophobic properties to the substrate surface in a manner similar as alkyltrichlorosilanes.

In one embodiment the POSS polymer contains a compound represented by Formula (XXIX):

$$[R(SiO)_x(OH)_y] \qquad (XXIX)$$

where R is an alkyl, aromatic, fluorinated alkyl, an alkyl ether or a fluorinated alkyl ether containing from about 1 to about 30 carbon atoms; x is from about 1 to about 4; and y is from about 1 to about 4. In another embodiment, R is an alkyl, aromatic, fluorinated alkyl, an alkyl ether or a fluorinated alkyl ether containing from about 6 to about 20 carbon atoms; x is from about 1 to about 3; and y is from about 1 to about 3. Such a compound can be made by stirring $RSiX_3$, such as an alkyl trihalosilane, in water and permitting it to hydrolyze, using an acid or base (such as HCl or ammonium hydroxide, respectively) to further hydrolyze the first hydrolization product.

Examples of POSS polymers include poly(p-hydroxybenzylsilsesquioxane) (PHBS); poly(p-hydroxybenzylsilsesquioxane-co-methoxybenzylsilsesquioxane) (PHB/MBS); poly (p-hydroxybenzylsilsesquioxane-co-t-butylsilsesquioxane) (PHB/BS); poly(p-hydroxybenzylsilsesquioxane-co-cyclohexylsilsesquioxane) (PHB/CHS); poly(p-hydroxybenzylsilsesquioxane-co-phenylsilsesquioxane) (PHB/PS); poly(p-hydroxybenzylsilsesquioxane-co-bicycloheptylsilsesquioxane) (PHB/BHS); poly(p-hydroxyphenylethylsilsesquioxane) (PHPES); poly(p-hydroxyphenylethylsilsesquioxane-co-p-hydroxy-α-methylbenzylsilsesquioxane) (PHPE/HMBS); poly(p-hydroxyphenylethylsilsesquioxane-co-methoxybenzylsilsesquioxane) (PHPE/MBS); poly(p-hydroxyphenylethylsilsesquioxane-co-t-butylsilsesquioxane) (PHPE/BS); poly(p-hydroxyphenylethylsilsesquioxane-co-cyclohexylsilsesquioxane) (PHPE/CHS); poly(p-hydroxyphenylethylsilsesquioxane-co-phenylsilsesquioxane) (PHPE/PS); poly(p-hydroxyphenylethylsilsesquioxane-co-bicycloheptylsilsesquioxane) (PHPE/BHS); poly(p-hydroxy-α-methylbenzylsilsesquioxane) (PHMBS); poly(p-hydroxy-α-methylbenzylsilsesquioxane-co-p-hydroxybenzylsilsesquioxane) (PHMB/HBS); poly(p-hydroxy-α-methylbenzylsilsesquioxane-co-methoxybenzylsilsesquioxane) (PHMB/MBS); poly(p-hydroxyo-methylbenzylsilsesquioxane-co-t-butylsilsesquioxane) (PHMB/BS); poly(p-hydroxy-α-methylbenzylsilsesquioxane-co-cyclohexylsilsesquioxane) (PHMB/CHS); poly(p-hydroxy-α-methylbenzylsilsesquioxane-co-phenylsilsesquioxane) (PHMB/PS); poly(p-hydroxy-α-methylbenzylsilsesquioxane-co-bicycloheptylsilsesquioxane) (PHMB/BHS); and poly(p-hydroxybenzylsilsesquioxane-co-p-hydroxyphenylethylsilsesquioxane) (PHB/HPES).

The second hydrophobic layer contains at least one perfluoropolyether silicon compound and/or at least one amphiphilic molecule, so long as the contact angle of the second hydrophobic layer material is lower than the contact angle of the first hydrophobic layer material. In addition to the perfluoropolyether silicon compounds and amphiphilic molecules described above, the second hydrophobic layer may contain a POSS material containing any of an alcohol group, a phenyl group, an olefin group, an amino group, an epoxy group, a halogen group, an alkoxy group, or an ester group, but not a fluorocarbon group.

For example, in one embodiment the POSS polymer of the second hydrophobic layer contains a compound represented by Formula (XXIX):

$$[R(SiO)_x(OH)_y] \quad \text{(XXIX)}$$

where R is an alcohol group, a phenyl group, an olefin group, an amino group, an epoxy group, a halogen group, an alkoxy group, or an ester group, but not a fluorocarbon group containing from about 1 to about 30 carbon atoms; x is from about 1 to about 4; and y is from about 1 to about 4.

In another embodiment, the second hydrophobic layer contains compounds are represented by Formula I:

$$R_mSiH_nR^2OCH_2Z \quad \text{(I)}$$

where each R is independently an alkyl, hydroxyalkyl, alkoxy, alkyl ether, aryl, aryloxy, substituted aryl, all of which contain from about 1 to about 20 carbon atoms, halogens, hydroxy, and acetoxy; $R^2$ is alkyl containing from about 2 to about 10 carbon atoms; Z is an alcohol group, a phenyl group, an olefin group, an amino group, an epoxy group, a halogen group, an alkoxy group, or an ester group, but not a fluorocarbon group containing from about 1 to about 30 carbon atoms; and m is from about 1 to about 3, n is from 0 to about 2, and m+n equal 3.

Additional examples of materials for the second hydrophobic layer include many from Hybrid Plastics Inc. Some examples specifically include Products # SO1458, Trisilanol Phenyl-POSS, Mwt. 931.34; Product # S01400, Trisilanol Cyclohexyl-POSS, Mwt. 973.69; Product # OL1110, Cyclohexenylethylcyclopentyl-POSS, Mwt. 1109.76; Product # MS0840, OctaPhenyl-POSS, Mwt. 1033.53; Product # MS0860, OctaTMA-POSS, Mwt. 2218; Product # MS0870, Phenethyl-POSS, Mwt. 1257.96; Product# HA0626 Chlorophenyl Phenyl-POSS, Mwt. 1067.95; Product # EP0425, Glycidyl Phenyl-POSS, Mwt. 1071.55; Product# AM0285, Octa Ammonium-POSS, Mwt. 1173.18; Product # AK0239, TriethoxysilylethylCyclohexyl-POSS, Mwt. 1190.06; Product # AL0127, 1,2 Propanediol Cyclohexyl-POSS; Product# MS0870, Phenethyl-POSS, Mwt. 1257.96; and Product # MS0870, Phenethyl-POSS, Mwt. 1257.96.

In order to facilitate storing and/or loading the materials of the first and second hydrophobic layers, the materials may be charged to a container, ampoule, crucible, or porous carrier, and the materials of the first and second hydrophobic layers may be optionally combined with a solvent. It is desirable that the materials of the first and second hydrophobic layers are substantially uniformly distributed throughout the porous carrier, when the porous carrier is employed.

Solvents to which the materials of the first and second hydrophobic layers may be combined are generally non-polar organic solvents. Such solvents typically include alcohols such as isopropanol; alkanes such as cyclohexane and methyl cyclohexane; aromatics such as toluene, trifluorotoluene; alkylhaolsilanes, alkyl or fluoralkyl substituted cyclohexanes; ethers; perfluorinated liquids such as perfluorohexanes; and other hydrocarbon containing liquids. Examples of perfluorinated liquids include those under the trade designation Fluorinert™ and Novec™ available from 3M. When combining the materials of the first and second hydrophobic layers with one or more solvents, heat may be optionally applied to facilitate formation of a uniform mixture.

A coating catalyst and/or a quencher may be combined with the materials of the first and second hydrophobic layers to facilitate the coating process. Coating catalysts include metal chlorides such as zinc chloride and aluminum chloride, and mineral acids while quenchers include zinc powders and amines. Each is present an amount from about 0.01% to about 1% by weight.

Generally speaking, the coated substrate is made by forming the first hydrophobic layer on the substrate (or on the optional antireflection coating which is over the substrate). Subsequently, the second hydrophobic layer is formed over the first hydrophobic layer. Each of the first and second hydrophobic layers are typically made by contacting the substrate yet to be coated with the material that forms the first or second hydrophobic layers, often under reduced pressure and/or elevated temperatures.

The container, ampoule, crucible, or porous carrier containing the materials of the first and second hydrophobic layers mixture and solvent may be treated to remove the solvent or substantially all of the solvent by any suitable means. For example, evaporation or vacuum distillation may be employed. After solvent is removed, heat is applied until a constant weight is achieved. In this instance, heating at a temperature from about 40 to about 100° C. is useful. In most instances, the materials of the first and second hydrophobic layers solidifies, becomes semi-solid, or becomes a low viscosity liquid and is retained in the container, ampoule, crucible, or pores of the porous carrier.

The container, ampoule, crucible, or porous carrier may be made of any material inert to the materials of the first and second hydrophobic layers, such as porcelain, glass, pyrex, metals, metal oxides, and ceramics. Specific examples of materials that may form the porous carrier include one or more of alumina, aluminum silicate, aluminum, brass, bronze, chromium, copper, gold, iron, magnesium, nickel, palladium, platinum, silicon carbide, silver, stainless steel, tin, titanium, tungsten, zinc, zirconium, Hastelloy®, Kovar®, Invar®, Monel®, Inconel®, and various other alloys.

Examples of porous carriers include those under the trade designation Moft Porous Metal, available from Mott Corporation; those under the trade designation Kellundite available from Filtros Ltd.; and those under the trade designations Metal Foam, Porous Metal Media and Sinterflo®, available from Provair Advanced Materials Inc. methods of using a porous carrier are described in U.S. Pat. No. 6,881,445, which is hereby incorporated by reference.

Coating techniques involve exposing the substrate to the materials of the first and second hydrophobic layers in the container, ampoule, crucible, or on the porous carrier in a chamber or closed environment under at least one of reduced pressure, elevated temperature, irradiation, and power. Preferably, reduced pressure and/or elevated temperatures are employed. The reduced pressure, elevated temperatures, irradiation, and/or power imposed induce vaporization or sublimation of the materials of the first and/or second hydrophobic layers into the chamber atmosphere and subsequent self assembly and/or self-polymerization on the substrate surface (or antireflective surface) in a uniform and continuous fashion thereby forming the first or second hydrophobic coating. Alternatively, the substrate is exposed to the materials of the first and/or second hydrophobic layers by dipping, immersing, wipe-on techniques (for example using a cloth), coating using a blade, and the like.

In one embodiment, the substrate is exposed to the materials of the first and/or second hydrophobic layers under a pressure from about 0.000001 to about 760 torr (specifically including no applied vacuum). In another embodiment, the substrate is exposed to the materials of the first and/or second hydrophobic layers under a pressure from about 0.00001 to about 200 torr. In yet another embodiment, the substrate is exposed to the materials of the first and/or second hydrophobic layers under a pressure from about 0.0001 to about 100 torr.

In one embodiment, the materials of the first and/or second hydrophobic layers are heated to a temperature from about 20 to about 400° C. In another embodiment, the materials of the first and/or second hydrophobic layers are heated to a temperature from about 40 to about 350° C. In yet another embodiment, the materials of the first and/or second hydrophobic layers are heated to a temperature from about 50 to about 300° C. Only the materials of the first and/or second hydrophobic layers need to be at the temperature described above to induce coating formation. The substrate is at about the same or at a different temperature as the materials of the first and/or second hydrophobic layers in the chamber. The materials of the first and/or second hydrophobic layers are at about the same or at a different temperature as the atmosphere of the chamber. The substrate is at about the same or at a different temperature as the atmosphere of the chamber. In one embodiment, each of the substrate, materials of the first and/or second hydrophobic layers, and atmosphere is at a temperature from about 20 to about 400° C.

General examples of coating forming techniques include dipping (in a coating solution); wet application (spraying, wiping, printing, stamping); vapor deposition; vacuum deposition; vacuum coating; box coating; sputter coating; vapor deposition or chemical vapor deposition (CVD) such as low pressure chemical vapor deposition (LPCVD), plasma enhanced chemical vapor deposition (PECVD), high temperature chemical vapor deposition (HTCVD); and sputtering. Such techniques are known in the art and not described for brevity sake.

Vapor deposition/chemical vapor deposition techniques and processes have been widely disclosed in literature, for example: *Thin Solid Films,* 1994, 252, 32-37; *Vacuum technology* by Ruth A. 3rd edition, Elsevier Publication, 1990, 311-319; *Appl. Phys. Lett.* 1992, 60, 1866-1868; *Polymer Preprints,* 1993, 34, 427-428; U.S. Pat. Nos. 6,265,026; 6,171,652; 6,051,321; 5,372,851; and 5,084,302, which are hereby incorporated by reference for their teachings in forming coatings or depositing organic compounds on substrates.

In another embodiment, a thin hydrophobic film can be formed using one or more materials of the first and/or second hydrophobic layers in solution and contacting the substrate surface by immersion or wipe-on with a wet cloth at ambient conditions of the coating solution. Diluting the materials of the first and/or second hydrophobic layers in an inert solvent such as perfluorohexane at a concentration from about 0.001% to about 5% by weight makes the coating solution. The coating solution may alternatively contain from about 0.01% to about 1% by weight of one or more materials of the first and/or second hydrophobic layers. Excess polymer is removed by wiping the surface with a clean tissue paper and then air cured to get the highly cross-linked network of the thin hydrophobic film polymer on the substrate surface.

The first hydrophobic layer is relatively permanent and advantageous for providing one or more of the types of films/coating on a substrate: a protective film, an anti-corrosion coating, a wear resistant coating, an anti-smudge film (meaning the substrate surface stays clean).

The first hydrophobic layer has a contact angle that is greater than the contact angle of the second hydrophobic layer. In one embodiment, the contact angle of the first hydrophobic layer is at least about 10° higher than the contact angle of the second hydrophobic layer. In another embodiment, the contact angle of the first hydrophobic layer is at least about 20° higher than the contact angle of the second hydrophobic layer. In yet another embodiment, the contact angle of the first hydrophobic layer is at least about 30° higher than the contact angle of the second hydrophobic layer. In still yet another embodiment, the contact angle of the first hydrophobic layer is at least about 40° higher than the contact angle of the second hydrophobic layer. In still yet another embodiment, the contact angle of the first hydrophobic layer is at least about 50° higher than the contact angle of the second hydrophobic layer. In another embodiment, the contact angle of the first hydrophobic layer is at least about 70° higher than the contact angle of the second hydrophobic layer.

In one embodiment, the contact angle of the first hydrophobic layer is at least about 30° or higher. In another embodiment, the contact angle of the first hydrophobic layer is from about 40° to about 130°. In yet another embodiment, the contact angle of the first hydrophobic layer is from about 50° to about 120°. In still yet another embodiment, the contact angle of the first hydrophobic layer is from about 75° to about 115°.

In one embodiment, the contact angle of the second hydrophobic layer is at least about 100° or lower. In another embodiment, the contact angle of the second hydrophobic layer is from about 10° to about 90°. In yet another embodiment, the contact angle of the second hydrophobic layer is from about 20° to about 70°. In still yet another embodiment, the contact angle of the second hydrophobic layer is from about 25° to about 50°.

The contact angle can be measured using a Rame-hart, Inc. Goneometer model # 100-00 with distilled water on a coated glass substrate. Poorly bonded or phased hydrophobic is removed after processing the lens with water or alcohol or simply wipe-off, after which bonded or first super hydrophobic remained on the substrate. The contact angle is, in one sense, a measurement of hydrphobicity, and hydrphobicity can be controlled by appropriately selecting the various R and Z groups of the formulae described above.

The second hydrophobic layer is relatively temporary and advantageous for its ability to be easily removed after handling of the coated substrate is finished, or at least some processing of the coated substrate is finished. The second hydrophobic layer allows one to securely hold the coated substrate to facilitate its processing, such as edging, shaping, or cutting the coated substrate, which would otherwise be difficult if the second hydrophobic layer is absent. The second hydrophobic layer is poorly or weakly bonded to the first hydrophobic layer, enabling it to be phased out and removed using water or alcohol or simply wiping the substrate off, after which the bonded or first hydrophobic layer remains bonded on the substrate.

The first hydrophobic layer and second hydrophobic layer formed on the substrate generally have a uniform thickness over the substrate. In one embodiment, the thicknesses of the hydrophobic layers are independently from about 0.1 nm to about 250 nm. In another embodiment, the thicknesses of the hydrophobic layers are independently from about 1 nm to about 200 nm. In yet another embodiment, the thicknesses of the hydrophobic layers are independently is from about 2 nm to about 100 nm. In still yet another embodiment, the thicknesses of the hydrophobic layers are independently from about 5 nm to about 20 nm. In another embodiment, the thicknesses of the hydrophobic layers are independently about 10 nm or less. The thickness of the hydrophobic layers may be controlled by adjusting the deposition parameters.

With respect to any figure or numerical range for a given characteristic, a figure or a parameter from one range may be combined with another figure or a parameter from a different range for the same characteristic to generate a numerical range.

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An article, comprising:

a substrate;

a first hydrophobic layer over the substrate, the first hydrophobic layer having a first contact angle; and a second hydrophobic layer over the first hydrophobic layer, the second hydrophobic layer having a second contact angle, the first contact angle being greater than the second contact angle.

2. The article of claim 1, wherein the first hydrophobic layer comprises at least one perfluoropolyether silicon compound.

3. The article of claim 1, wherein the first hydrophobic layer comprises a perfluoropolyether silicon compound represented by Formula I:

$$R_mSiH_nR^2OCH_2Z \qquad (I)$$

where each R is independently an alkyl, hydroxyalkyl, alkoxy, alkyl ether, aryl, aryloxy, substituted aryl, all of which contain from about 1 to about 20 carbon atoms, halogens, hydroxy, and acetoxy; $R^2$ is alkyl containing from about 2 to about 10 carbon atoms; Z is fluorinated alkyl ether containing from about 2 to about 2,000 carbon atoms; and m is from about 1 to about 3, n is from 0 to about 2, and m+n equal 3.

4. The article of claim 1, wherein the first hydrophobic layer comprises an amphiphilic molecule represented by Formula XXIII:

$$R_mSiZ_n \qquad (XXIII)$$

where each R is individually an alkyl, fluorinated alkyl, alkyl ether or fluorinated alkyl ether containing from about 1 to about 30 carbon atoms, substituted silane, or siloxane; each Z is individually one of halogens, hydroxy, alkoxy and acetoxy;

and m is from about 1 to about 3, n is from about 1 to about 3, and m+n equal 4.

5. The article of claim 1, wherein the first hydrophobic layer comprises an amphiphilic molecule represented by Formula XXIV:

$$R_mSH_n \qquad (XXIV)$$

where R is an alkyl, fluorinated alkyl, an alkyl ether or a fluorinated alkyl ether containing from about 1 to about 30 carbon atoms; S is sulfur; H is hydrogen; m is from about 1 to about 2 and n is from 0 to 1.

6. The article of claim 1, wherein the second hydrophobic layer comprises a polyhedral oligomeric silsesquioxane compound represented by Formula (XXIX):

$$[R(SiO)_x(OH)_y] \qquad (XXIX)$$

where R is an alcohol group, a phenyl group, an olefin group, an amino group, an epoxy group, a halogen group, an alkoxy group, or an ester group, but not a fluorocarbon group containing from about 1 to about 30 carbon atoms; x is from about 1 to about 4; and y is from about 1 to about 4.

7. The article of claim 1, wherein the second hydrophobic layer comprises at least one perfluoropolyether silicon compound.

8. The article of claim 1, wherein the second hydrophobic layer comprises an amphiphilic molecule.

9. The article of claim 1 further comprising an antireflection coating over the substrate, and the first hydrophobic layer is positioned over the antireflection coating.

10. The article of claim 9, wherein the antireflection coating has a thickness from about 0.1 nm to about 1,000 nm.

11. The article of claim 1, wherein the substrate is one selected from the group consisting of glasses, ceramics, porcelains, fiberglass, metals, thermosets, thermoplastics, and ceramic tile.

12. The article of claim 1, wherein the contact angle of the first hydrophobic layer is at least about 10° higher than the contact angle of the second hydrophobic layer.

13. The article of claim 1, wherein the contact angle of the first hydrophobic layer is from about 40° to about 130° and the contact angle of the second hydrophobic layer is from about 10° to about 90°.

14. A method of making a coated substrate, comprising:

forming a first hydrophobic layer at least partially over a substrate, the first hydrophobic layer having a first contact angle; and forming a second hydrophobic layer at least partially over the first hydrophobic layer, the second hydrophobic layer having a second contact angle, the first contact angle being greater than the second contact angle.

15. The method of claim 14, wherein forming the first hydrophobic layer comprises exposing the substrate to materials of the first hydrophobic layer in a container, ampoule, crucible, or porous carrier in a chamber under at least one of reduced pressure, elevated temperature, irradiation, and power.

16. The method of claim 14, wherein forming the second hydrophobic layer comprises exposing the substrate to materials of the second hydrophobic layer in a container, ampoule, crucible, or porous carrier in a chamber under at least one of reduced pressure, elevated temperature, irradiation, and power.

17. The method of claim 14, wherein forming the first hydrophobic layer comprises exposing the substrate to materials of the first hydrophobic layer under a pressure from about 0.000001 to about 760 torr and forming the second hydrophobic layer comprises exposing the substrate to materials of the second hydrophobic layer under a pressure from about 0.000001 to about 760 torr.

18. The method of claim 14, wherein forming the first hydrophobic layer comprises heating materials of the first hydrophobic layer to a temperature from about 20 to about 400° C. and forming the second hydrophobic layer comprises heating materials of the second hydrophobic layer to a temperature from about 20 to about 400° C.

19. The method of claim 14, wherein one of vapor deposition techniques and chemical vapor deposition techniques are employed to form the first hydrophobic layer.

20. The method of claim 14, wherein one of immersion techniques or wipe-on techniques are employed to form the second hydrophobic layer.

* * * * *